(12) United States Patent
Meng et al.

(10) Patent No.: US 10,188,003 B2
(45) Date of Patent: Jan. 22, 2019

(54) PLASTIC FRAME, BACKLIGHT MODULE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xiaoming Meng, Beijing (CN); Zhen Jin, Beijing (CN); Byung-In Park, Beijing (CN); Hui Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/567,371

(22) PCT Filed: Apr. 10, 2017

(86) PCT No.: PCT/CN2017/079959
§ 371 (c)(1),
(2) Date: Oct. 17, 2017

(87) PCT Pub. No.: WO2017/177878
PCT Pub. Date: Oct. 19, 2017

(65) Prior Publication Data
US 2018/0295729 A1    Oct. 11, 2018

(30) Foreign Application Priority Data

Apr. 11, 2016  (CN) .................... 2016 2 0302917 U

(51) Int. Cl.
*G02F 1/1333* (2006.01)
*H05K 5/00* (2006.01)
*H05K 5/02* (2006.01)

(52) U.S. Cl.
CPC ..... *H05K 5/0017* (2013.01); *G02F 1/133308* (2013.01); *H05K 5/0217* (2013.01); *G02F 2001/13332* (2013.01)

(58) Field of Classification Search
CPC .......... G02F 2001/133317; G02F 2001/13332; G02F 2001/133322; G02F 1/133305; G02F 1/133308; H05K 5/0017; H05K 5/0217

See application file for complete search history.

(56) References Cited

U.S. PATENT DOCUMENTS 9,316,854 B2  4/2016  Lee
9,507,079 B2  11/2016  Park et al.
(Continued)

FOREIGN PATENT DOCUMENTS

CN    102778769 A    11/2012
CN    202975532 U     6/2013
(Continued)

OTHER PUBLICATIONS

International Search Report & Written Opinion, for PCT Patent Application No. PCT/CN2017/079959, dated Jun. 29, 2017, 18 pages.

*Primary Examiner* — Anh Mai
*Assistant Examiner* — Steven Horikoshi
(74) *Attorney, Agent, or Firm* — Kinney & Lange, P.A.

(57) ABSTRACT

A plastic frame, a backlight module and a display device including the backlight module are disclosed. The backlight module includes a front frame, a display panel, an adhesive tape and a plastic frame. The plastic frame includes a frame
(Continued)

body, an upwardly extending protrusion is provided along an inner edge of the frame body at an inner side of the frame body, and a mounting surface is provided on an upper surface of the frame body at an outer side of the protrusion. The front frame covers the mounting surface, the display panel is carried on an inner side of the plastic frame, the adhesive tape is adhered to the upper surface of the front frame and the upper surface of the protrusion, and the adhesive tape is adhered to the upper surface of the display panel.

20 Claims, 2 Drawing Sheets

(56) References Cited

U.S. PATENT DOCUMENTS

| | | |
|---|---|---|
| 2014/0036195 A1 | 2/2014 | Kuo et al. |
| 2014/0176851 A1 | 6/2014 | Lee |
| 2015/0160405 A1 | 6/2015 | Park et al. |
| 2016/0341887 A1 | 11/2016 | Fang et al. |

FOREIGN PATENT DOCUMENTS

| | | |
|---|---|---|
| CN | 203241655 U | 10/2013 |
| CN | 104344292 A | 2/2015 |
| CN | 104700719 A | 6/2015 |
| CN | 205535626 U | 8/2016 |
| KR | 20080049325 A | 6/2008 |

PLASTIC FRAME, BACKLIGHT MODULE AND DISPLAY DEVICE

CROSS-REFERENCE TO RELATED APPLICATION

This application is a Section 371 National Stage Application of International Application No. PCT/CN2017/079959, filed on Apr. 10, 2017, entitled "PLASTIC FRAME, BACKLIGHT MODULE AND DISPLAY DEVICE", which claims priority to Chinese Patent Application No. 201620302917.1 filed on Apr. 11, 2016 with SIPO, incorporated herein by reference in their entirety.

BACKGROUND

Technical Field

Embodiments of the present disclosure relate to a field of display technology, and more particularly, to a plastic frame, a backlight module and a display device.

Description of the Related Art

In view of improving a strength of a device and preventing dust, an adhesive tape may be used in a backlight module. A combination of the adhesive tape and a frame or the like of the backlight module can not only play a sealing effect, but also improve a bonding strength. However, in such a backlight module, there may be a phenomenon of light leakage between the adhesive tape and a display panel.

SUMMARY

In a first aspect, in an embodiment of the present disclosure, there is provided a plastic frame comprising a frame body, wherein an upwardly extending protrusion is provided along an inner edge of the frame body at an inner side of the frame body, and a mounting surface is provided on an upper surface of the frame body at an outer side of the protrusion.

Further, the mounting surface is shaped such that a thickness of a portion of the frame body at the mounting surface is less than a thickness of a portion of the frame body at the protrusion.

Further, an inwardly extending carrying portion is provided at an inner side of the plastic frame.

Further, the carrying portion is shaped such that an upper surface of the carrying portion is lower in a vertical direction than an upper surface of the protrusion.

In a second aspect, in an embodiment of the present disclosure, there is provided a backlight module comprising a front frame, a display panel and an adhesive tape, wherein the backlight module further comprises the plastic frame according to any one of the above-described embodiments, wherein the front frame covers the mounting surface, the display panel is carried on an inner side of the plastic frame, the adhesive tape extends from an upper surface of the front frame to an upper surface of the protrusion and is adhered to the upper surface of the front frame and the upper surface of the protrusion, and the adhesive tape further extends from the upper surface of the protrusion to an upper surface of the display panel and is adhered to the upper surface of the display panel.

Further, the upper surface of the protrusion is flush with the upper surface of the front frame.

Further, an inwardly extending carrying portion is provided at an inner side of the plastic frame, and the display panel is carried on the carrying portion.

Further, the carrying portion is shaped such that an upper surface of the carrying portion is lower in a vertical direction than the upper surface of the protrusion.

Further, the upper surface of the display panel is flush with the upper surface of the protrusion.

In a third aspect, in an embodiment of the present disclosure, there is provided a display device comprising the backlight module according to any one of the above-described embodiments.

BRIEF DESCRIPTION OF THE DRAWINGS

In order to more clearly illustrate the technical solutions of the embodiments of the present disclosure, the drawings, which are used in the description of the embodiments, will be briefly described below. It will be apparent that the drawings in the following description only represent some embodiments of the present disclosure. Other drawings may be obtained by those skilled in the art according to these drawings without creative efforts.

DETAILED DESCRIPTION OF PREFERRED EMBODIMENTS

In order to more clearly provide the objectives, technical solutions and advantages of the embodiments of the present disclosure, the technical solutions in the embodiments of the present disclosure will be clearly and completely described below, with reference to the accompanying drawings in the embodiments of the present disclosure. It will be apparent that the described embodiments only represent a part of the present disclosure, rather than all the embodiments of the present disclosure. All other embodiments obtained by those skilled in the art based on the embodiments of the present disclosure without creative efforts fall within the scope of the present disclosure.

In order to at least partially address the drawbacks in the related art, the present disclosure provides a plastic frame, a backlight module and a display device capable of solving the light leakage problem between the adhesive tape and the display panel.

Figure 1:
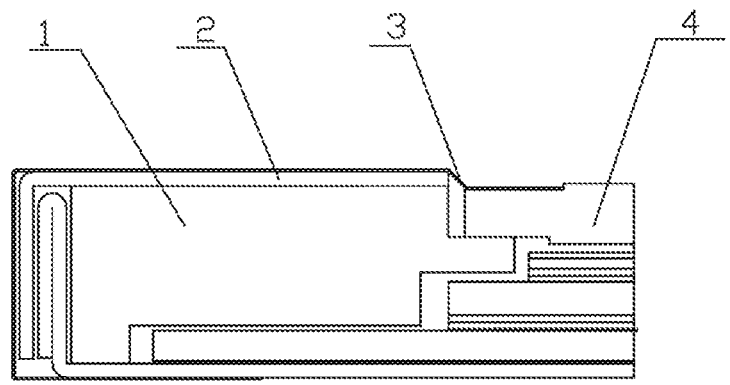
FIG. 1 is a first partial cross-sectional view of a backlight module of a basic structure according to an embodiment of the present disclosure (in a standard state)
Figure 2:
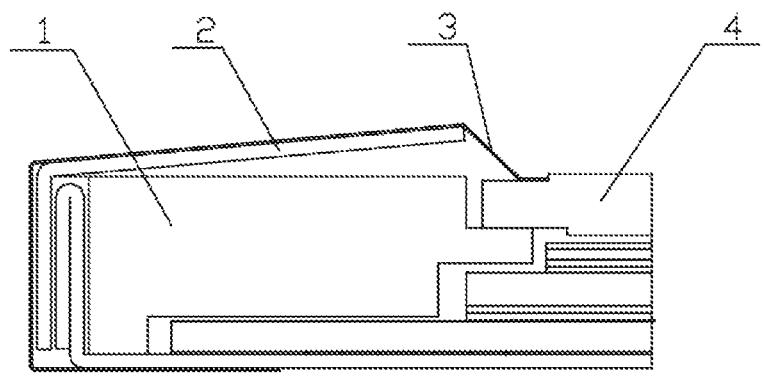
FIG. 2 is a second partial cross-sectional view of the backlight module of the basic structure according to the embodiment of the present disclosure (in a warping state)

FIGS. 1 and 2 show a backlight module of a basic structure according to an embodiment of the present disclosure. In FIGS. 1 and 2, a module for an electronic drawing panel is taken as an example, and only one edge in the periphery of a display panel is shown in a cross-sectional view. In view of strength and dustproof requirements, the module for the electronic drawing panel adopts a combination of a front frame 2 and an adhesive tape 3. As shown in FIGS. 1 and 2, the front frame 2 is provided on a plastic frame 1, an inner side of an opening of the front frame 2 is flush with an inner side of an opening of the plastic frame 1 (see a right side edge of the front frame 2 in FIG. 1), the adhesive tape 3 is only adhered to a display panel 4 and the front frame 2. In this way, an outward warp of the front frame may occur at the opening of the front frame 2 due to an engagement gap between the plastic frame 1 and a back plate and an flatness of the front frame 2 (see FIG. 2), it would pull the adhesive tape 3 and causes an partial unstable adhesion between the adhesive tape 3 and the display panel 4, thereby finally resulting in a light leakage phenomenon between the adhesive tape 3 and the display panel 4 (see FIG. 2).

Figure 3:
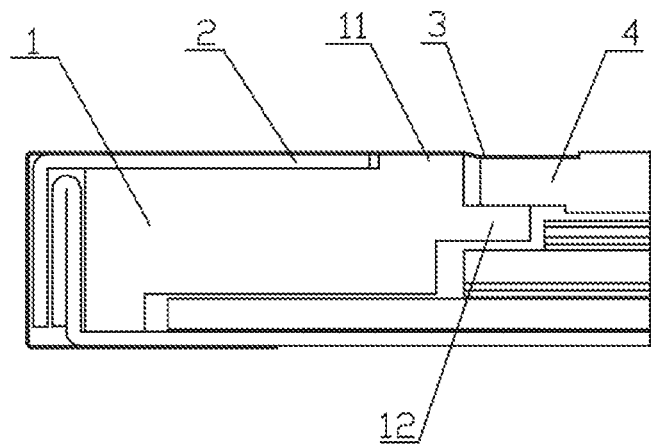
FIG. 3 is a first partial cross-sectional view of a backlight module according to an improved embodiment of the present disclosure (in a standard state)
Figure 4:
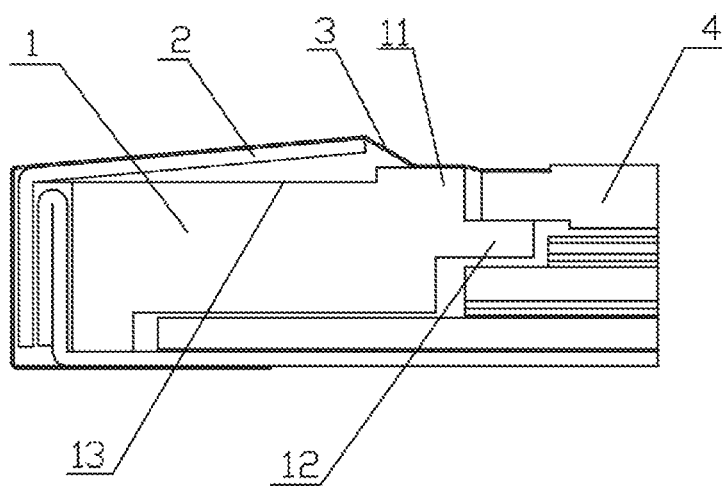
FIG. 4 is a second partial cross-sectional view of the backlight module according to the improved embodiment of the present disclosure (in a warping state).

As shown in FIG. 3, the present disclosure provides an improved backlight module comprising a front frame 2, a plastic frame 1, a display panel 4 and a tape 3. The plastic frame 1 includes a frame body, an upwardly extending protrusion 11 is provided along an inner edge of the frame body at an inner side of the frame body, and a mounting surface 13 is provided on an upper surface of the frame body at an outer side of the protrusion 11. The front frame 2 covers the mounting surface 13, and the mounting surface 13 is shaped such that a thickness of a portion of the frame body at the mounting surface 13 is less than a thickness of a portion of the frame body at the protrusion 11, i.e., a height of the mounting surface 13 is less than a height of the protrusion 11. Specifically, a rectangular opening is optionally provided in the middle of the front frame 2 to form a hollow frame structure, an inner side of the rectangular opening of the front frame 2 may abut against the outer side of the protrusion 11, or alternatively, there is a gap therebetween. In the case that there is a gap between the front frame 2 and the protrusion 11, a certain mounting margin is provided between the front frame 2 and the protrusion 11 of the plastic frame 1, thereby it facilitates the installation of the front frame 2. Further, a certain deformation space is provided for the front frame 2, thereby it avoids a warp of the front frame 2. Optionally, an upper surface of the protrusion 11 is flush with an upper surface of the front frame 2, the display panel 4 is carried on an inner side of the plastic frame 1, the adhesive tape 3 extends from the upper surface of the front frame 2 to the upper surface of the protrusion 11 of the plastic frame 1 and is adhered to the upper surface of the front frame and the upper surface of the protrusion, and the adhesive tape extends from the upper surface of the protrusion 11 to an upper surface of the display panel 4 and is adhered to the upper surface of the display panel. Since the protrusion 11 is provided, it is ensured that the adhesive tape 3 can be adhered to the plastic frame 1. In this way, if the front frame 2 warps outwardly, as shown in FIG. 4, only a portion of the adhesive tape 3 adhered to the plastic frame 1 may be pulled, thus it ensures direct adhering widths of the adhesive tape 3 and the display panel 4 and ensures that no light leakage occurs from the adhesive tape 3. In addition, since the protrusion 11 is provided, it is possible to increase the size of the rectangular opening of the front frame 2 and save material, and it is also possible to reduce a requirement for a fitting accuracy of the front frame 2 and the plastic frame 1.

Further, at a side edge of the protrusion 11, a width of the protrusion 11 in an extension direction of the display panel 4 is between ⅕ and ⅓ of a width of the front frame 2 corresponding to the side edge. Such a width of the protrusion 11 on one hand provides a sufficient adhesion area for the adhesive tape 3 so as to provide a sufficient restraining force when the front frame 2 warps outwardly, on the other hand ensures that the front frame 2 can be firmly engaged with the plastic frame 1. It should be noted that an excessive width of the protrusion 11 will cause an engagement surface of the front frame 2 and the plastic frame 1/the adhesive tape 3 to be excessively small to affect the fixing of the front frame 2.

In order to facilitate positioning the display panel 4 and the plastic frame 1, as shown in FIG. 3 or 4, an inwardly extending carrying portion 12 is provided at an inner side of the plastic frame 1, and an outer side of the display panel 4 is carried on the carrying portion 12. The carrying portion 12 is shaped such that an upper surface of the carrying portion 12 is lower in a vertical direction than the upper surface of the protrusion 11.

As an example, a vertical distance between the upper surface of the carrying portion 12 and the upper surface of the protrusion 11 is greater than a vertical distance between the mounting surface 13 and the upper surface of the protrusion 11. In addition, the carrying portion 12 has a lower surface which is parallel to the upper surface of the carrying portion, and a width of the upper surface of the carrying portion in the extension direction of the display panel 4 is less than a width of the lower surface of the carrying portion in the extension direction of the display panel 4. A height of the carrying portion 12 is greater than the vertical distance between the mounting surface 13 and the upper surface of the protrusion 11.

Further, the upper surface of the display panel 4 is flush with the upper surface of the protrusion 11, thereby avoiding any height difference between the front frame 2 and the display panel 4, and optimizing the overall structure.

In addition, in an embodiment of the present embodiment, there is also provided a display device including the above-described backlight module. By providing the backlight module, it is possible for the display panel 4 to ensure that no light leakage occurs from the adhesive tape 3.

According to the above-described technical solutions, the embodiments of the present disclosure have improved the structure of the plastic frame, in particular, an upwardly extending protrusion is provided along an inner edge of a frame body of the plastic frame at an inner side of the frame body, and a mounting surface is provided on an upper surface of the frame body at an outer side of the protrusion. Further, a front frame covers the mounting surface, a display panel is carried on an inner side of the plastic frame, an adhesive tape extends from an upper surface of the front frame to an upper surface of the protrusion and is adhered to the upper surface of the front frame and the upper surface of the protrusion, and the adhesive tape extends from the upper surface of the protrusion to an upper surface of the display panel and is adhered to the upper surface of the display panel. Since the protrusion is provided, it is ensured that the adhesive tape can be adhered to the plastic frame. In this way, if the front frame warps outwardly, only a portion of the adhesive tape adhered to the plastic frame may be pulled, thus it ensures direct adhering widths of the adhesive tape and the display panel and ensures that no light leakage occurs from the adhesive tape.

It can be seen that the embodiments of the present disclosure provides an ingenious structure, and can ensure that no light leakage occurs between the display panel 4 and the adhesive tape 3.

In the description of the embodiments of the present disclosure, it should be noted that the extension of the protrusion 11 toward an adhesion surface of the plastic frame 1 adhered to the front frame 2 refers to an "upward" extension, a side located close to the display panel 4 refers to an "inner" side, and a side located away from the display panel 4 refers to an "outer" side. The orientation description is merely for facilitating and simplifying the description of the embodiments of the present disclosure, rather than indicating or implying that the interested means or elements must have a specific orientation or be constructed and operated in a specific orientation, therefore it should not be construed as being limitative to the present disclosure. Unless otherwise expressly specified or defined, the terms "install", "connect", "join" should be understood in a broad sense, for example, they may refer to a fixed connection or a detachable connection or an integral connection; or they may refer to a mechanical connection or an electrical connection; or they may refer to a direct connection or an indirect connection via an intermediate medium; or they may refer to an internal connectivity of two elements. The specific meanings of the above terms in the present disclosure may be understood by those skilled in the art in light of specific circumstances.

In the specification of the present disclosure, a large number of specific details are set forth. It will be understood, however, that the embodiments of the present disclosure may be practiced without these specific details. In some cases, well-known methods, structures and techniques have not been shown in detail so as not to obscure the understanding of this specification.

Similarly, it should be understood that, in the description of the exemplary embodiments of the present disclosure, the various features of the present disclosure are sometimes grouped together into a single embodiment, drawing or description thereof in order to simplify the present disclosure and to assist in understanding one or more of the various disclosed aspects. However, this disclosure method should not be used to reflect the following intent: the claimed disclosure needs more features than those expressly recited in each claim. More specifically, as reflected in the claims, the number of the features in claims are less than the number of all the features in the previously disclosed single embodiment. Accordingly, the claims that follow the specific embodiments may be expressly incorporated into the specific embodiments, wherein each claim itself may be taken as a separate embodiment of the present disclosure.

It should be noted that the above embodiments are intended to illustrate the present disclosure and are not intended to limit the present disclosure, and it is possible for those skilled in the art to devise alternative embodiments without departing from the scope of the appended claims. In the claims, any reference signs between parentheses should not be construed as limiting the claims.

Finally, it should be noted that, the above embodiments are merely illustrative of the technical solutions of the present disclosure and are not intended to limit the present disclosure. Although the present disclosure has been described in detail with reference to the foregoing embodiments, it will be understood by those skilled in the art that the technical solutions described in the foregoing embodiments may also be modified or some or all of the technical features therein may be equivalently replaced. Such modifications or replacements do not make the resultant technical solutions depart from the scope of the embodiments of the present disclosure, and therefore fall within the scope of the claims and the specification of the present disclosure.

What is claimed is:

1. A backlight module comprising a front frame, a display panel, an adhesive tape and a plastic frame, wherein the plastic frame comprises a frame body, an upwardly extending protrusion is provided along an inner edge of the frame body at an inner side of the frame body, and a mounting surface is provided on an upper surface of the frame body at an outer side of the protrusion, and wherein the front frame covers the mounting surface, the display panel is carried on an inner side of the plastic frame, the adhesive tape extends from an upper surface of the front frame to an upper surface of the protrusion and is adhered to the upper surface of the front frame and the upper surface of the protrusion, and the adhesive tape further extends from the upper surface of the protrusion to an upper surface of the display panel and is adhered to the upper surface of the display panel.

2. The backlight module according to claim 1, wherein the upper surface of the protrusion is flush with the upper surface of the front frame.

3. A display device comprising the backlight module according to claim 2.

4. The backlight module according to claim 1, wherein an inwardly extending carrying portion is provided at the inner side of the plastic frame, and the display panel is carried on the carrying portion.

5. The backlight module according to claim 4, wherein the carrying portion is shaped such that an upper surface of the carrying portion is lower in a vertical direction than the upper surface of the protrusion.

6. A display device comprising the backlight module according to claim 5.

7. A display device comprising the backlight module according to claim 4.

8. The backlight module according to claim 1, wherein the upper surface of the display panel is flush with the upper surface of the protrusion.

9. A display device comprising the backlight module according to claim 8.

10. A display device comprising the backlight module according to claim 1.

11. The backlight module according to claim 1, wherein the mounting surface is shaped such that a thickness of a portion of the frame body at the mounting surface is less than a thickness of a portion of the frame body at the protrusion.

12. The backlight module according to claim 11, wherein the upper surface of the protrusion is flush with the upper surface of the front frame.

13. A display device comprising the backlight module according to claim 12.

14. The backlight module according to claim 11, wherein an inwardly extending carrying portion is provided at the inner side of the plastic frame, and the display panel is carried on the carrying portion.

15. The backlight module according to claim 14, wherein the carrying portion is shaped such that an upper surface of the carrying portion is lower in a vertical direction than the upper surface of the protrusion.

16. A display device comprising the backlight module according to claim 14.

17. A display device comprising the backlight module according to claim 15.

18. The backlight module according to claim 11, wherein the upper surface of the display panel is flush with the upper surface of the protrusion.

19. A display device comprising the backlight module according to claim 18.

20. A display device comprising the backlight module according to claim 11.

* * * * *